United States Patent [19]
Takenouchi et al.

[11] Patent Number: 5,576,577
[45] Date of Patent: Nov. 19, 1996

[54] MULTI-LAYER LEAD-FRAME FOR A SEMICONDUCTOR DEVICE

[75] Inventors: Toshikazu Takenouchi; Kuniyuki Hori; Mitsuharu Shimizu, all of Nagano, Japan

[73] Assignee: Shinko Electric Industries Co., Ltd., Nagano, Japan

[21] Appl. No.: 434,733

[22] Filed: May 4, 1995

Related U.S. Application Data

[63] Continuation of Ser. No. 248,175, May 24, 1994, abandoned.

[30] Foreign Application Priority Data

May 24, 1993 [JP] Japan ..................... 5-121328

[51] Int. Cl.$^6$ ............................................. H01L 23/495
[52] U.S. Cl. ........................ 257/672; 257/676; 257/677
[58] Field of Search ................................ 257/666, 758, 257/760, 774, 759, 670, 671, 676, 677, 788, 789, 790, 672, 703, 700

[56] References Cited

U.S. PATENT DOCUMENTS

| | | | |
|---|---|---|---|
| 3,617,817 | 11/1971 | Kawakatsu | 257/703 |
| 5,089,878 | 2/1992 | Lee | 257/666 |
| 5,237,202 | 8/1993 | Shimizu et al. | 257/672 |
| 5,311,057 | 5/1994 | McShane | 257/671 |

FOREIGN PATENT DOCUMENTS

| | | |
|---|---|---|
| 904407 | 6/1986 | Belgium . |
| 0180219 | 5/1986 | European Pat. Off. . |
| 3-218658 | 9/1991 | Japan . |
| 4-79264 | 3/1992 | Japan . |
| 4-73825 | 3/1992 | Japan . |
| 4-119659 | 4/1992 | Japan . |
| 4-114462 | 4/1992 | Japan . |
| 4-81860 | 12/1992 | Japan . |
| 5-160334 | 6/1993 | Japan . |
| 5-183096 | 7/1993 | Japan . |

OTHER PUBLICATIONS

Seyed Hassan Hashemi et al., "The Close Attached Capacitor: A Solution to Switching Noise Problems" *IEEE Transactions of Components, Hybrids, and Manufacturing Technology*, vol. 15, No. 6, Dec. 1992.

Primary Examiner—Sara W. Crane
Assistant Examiner—Jhihan Clark
Attorney, Agent, or Firm—Staas & Halsey

[57] ABSTRACT

A multi-layer lead-frame for a semiconductor device includes a signal layer made of a metal strip having a signal pattern including a plurality of lead lines. A power supply layer is adhered and laminated to the signal layer and a ground layer is adhered and laminated to the power supply layer. A ceramic plate made of a ferroelectric substance is disposed between the power supply and ground layers. Conductive adhesive material is disposed between said ceramic plate and said first metal layer, and between and adhering to said ceramic plate and said second metal layer.

5 Claims, 2 Drawing Sheets

MULTI-LAYER LEAD-FRAME FOR A SEMICONDUCTOR DEVICE

This application is a continuation of application Ser. No. 08/248,175, filed May 24, 1994, now abandoned.

BACKGROUND OF THE INVENTION

1. Field of the Invention

This invention relates to a lead-frame and, more particularly, relates to a multi-layer lead-frame for a resin-sealed type semiconductor device which includes a signal layer, at least two metal plates or planes, and a hermetically sealed resin.

2. Description of the Related Art

A conventionally known multi-layer lead-frame for a semiconductor device comprises at least three conducting layers, i.e., a signal layer, a power supply layer and a ground layer, which are affixed or laminated to each other, in turn, by means of electrically insulated films made of, for example, polyimide.

In such a multi-layer lead-frame, if a decoupling capacitor is disposed between the power supply layer and the ground layer, a kind of electrical noise, called "bounce", can be reduced and therefore the change or variation of the electrical voltage in the power supply system or the ground system due to switching operation of the semiconductor chip can be advantageously minimized.

Using such a multi-layer lead-frame enables the mounting of a relatively high-power semiconductor chip on the metal plane, due to the heat radiation from the metal plane. Also, the metal plane can be used as a ground layer or a power supply layer to improve the electrical characteristics of the semiconductor device.

Recently, however, since high-speed electronic devices have become more and more in demand, a voltage reduction can occur in the power supply and ground systems due to the simultaneous switching of the input and output buffers. This would lead an error in operation.

In order to solve the above problems and improve the electronic device, it has been proposed that the electrostatic capacitance is increased. In Japanese Unexamined Patent Publication (Kokai) No 4-73825, an insulation sheet is disposed between the power supply layer and the ground layer. Such an insulation sheet is made from an insulation resin that contains a ferroelectric substance such as tantalate oxide powder or barium titanate powder, to increase the electrostatic capacitance of the decoupling capacitor.

However, such a multi-layer lead-frame, known in the prior art has the following problems. That is to say, although a ferroelectric powder was merely contained in the insulation resin, it has been found that an expected theoretical value of electrostatic capacitance could not be obtained, even though the reasons are not clearly understood. For example, an insulation sheet containing barium titanate powder has a dielectric constant ($\epsilon$) of about 10.

As a decoupling capacitor having a large electrostatic capacitance, such as 10 nF to 50 nF, is required, the above-mentioned prior art cannot fully satisfy such a requirement.

To obtain a decoupling capacitor having a larger electrostatic capacitance, a large amount of ferroelectric powder could be contained in the insulation resin but the adhesive characteristic of the insulation resin would be significantly be reduced and therefore such a decoupling capacitor could not be practically used.

SUMMARY OF THE INVENTION

An object of the present invention is to provide a multi-layer lead-frame, for a semiconductor device, in which a decoupling capacitor having a large electrostatic capacitance, such as more than 10 nF, is contained.

Another object of the present invention is to provide a multi-layer lead-frame, for a semiconductor device, capable of overcoming the above-mentioned problems in relation to the prior art.

According to this invention, there is provided a multi-layer lead-frame for a semiconductor device comprising: a signal layer made of a metal strip having a signal pattern including a plurality of lead lines; a first metal layer adhered and laminated to a surface of said signal layer by means of an insulation sheet; a second metal layer; a ceramic plate made of a ferroelectric substance disposed between said first metal layer and said second metal layer; and conductive adhesive material, disposed between and adhering together said ceramic plate and said first metal layer and disposed between and adhering said ceramic plate to said second metal layer.

It is preferable that said first metal layer is a power supply layer and said second metal layer is a ground layer.

It is also preferable that said ceramic plate is made of a ceramic material consisting essentially of one of barium titanate and strontium titanate. Such a ceramic plate can be made by sintering a ceramic green sheet or a powdered ceramic substance.

It is also preferable that the conductive adhesive material is a conductive adhesive film made of an adhesive resin containing dispensed metallic powder.

In an embodiment of the invention, metallic films, such as gold-plated films, are formed on the respective surfaces of said ceramic plate.

According to this invention, the multi-layer lead-frame contains therein a decoupling capacitor having a large electrostatic capacitance, such as more than 10 nF, since a compact or high dense ceramic plate made by sintering ferroelectric powder is disposed between the metal layers.

In addition, according to the present invention, since the ceramic plate is provided on the respective surfaces thereof with metallic films, an improved multi-layer lead-frame can be obtained so that the electrostatic capacitance of the decoupling capacitor can be increased and the high frequency characteristic can be improved.

DESCRIPTION OF THE PREFERRED EMBODIMENTS

Referring now to the accompanying drawings, some preferred embodiments according to the present invention will now be described in detail.

Figure 1:
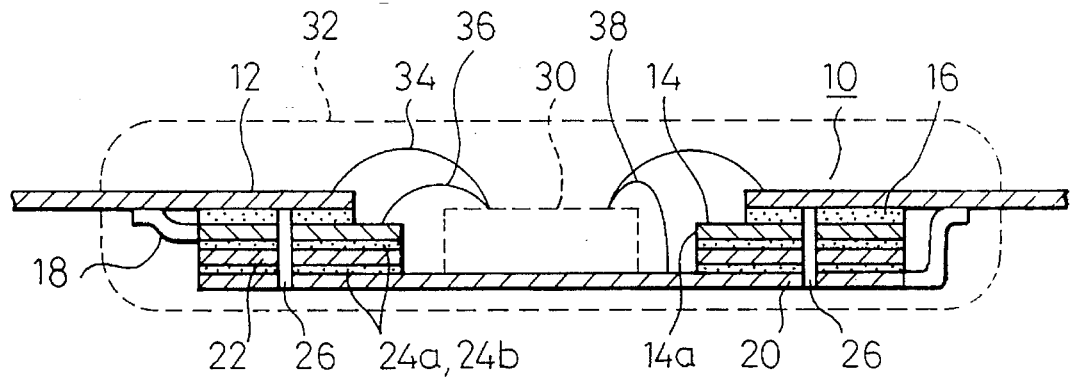
FIG. 1 is a cross-sectional view of an embodiment of a multi-layer lead-frame according to the present invention.

In FIG. 1, an embodiment of a multi-layer lead-frame according to the present invention is shown. A multi-layer lead-frame of this embodiment, generally indicated by a reference numeral 10, has a three-layer structure and comprises a signal layer 12, a power supply layer 14, and a ground layer 20. In this embodiment, the signal layer 12 is arranged as an upper layer, the power supply layer 14 is arranged as an intermediate layer, and the ground layer 20 is arranged as a lower layer.

As is well known, the signal layer 12 can be made by etching or punching a metal plate and has a plurality of inner leads, and outer leads, as a single layer lead-frame. In the same manner, the power supply layer 14 can be made by etching or punching a metal plate and has a square frame-like configuration having a central square opening 14a.

The power supply layer 14 is laminated on the inner lead portion of the signal layer 12 by means of an insulation sheet 16 having adhesive on the respective, opposite surfaces thereof. The inner periphery, i.e., the central opening 14a, of the power supply layer 14 protrudes inwardly from the inner ends of the inner leads of the signal layer 12 so that the power supply layer 14 can be electrically connected, at an optional (i.e., desired, or selected) position thereof, to a power supply terminal on the semiconductor chip 30 which is to be mounted on this multi-layer lead-frame. The power supply layer 14 has an outwardly projecting contact 18 which is electrically connected to a power line among the inner leads of the signal layer 12.

The ground layer 20 can also be made by etching or punching a metal plate and has a rectangular or square shape. The ground layer 20 is laminated on the power supply layer 14 through a ferroelectric ceramic plate 22 having conductive adhesive films 24a and 24b on the respective surfaces thereof. A semiconductor chip 30 is mounted on the ground layer 20.

The semiconductor chip 30 mounted on the multi-layer lead-frame is electrically connected to the signal layer 12, the power supply layer 14, and the ground layer 20 by bonding-wires, 34, 36 and 38, respectively, as is well known in this art. Then, the semiconductor chip 30 is hermetically sealed with a resin 32 to complete a semiconductor device.

Figure 2:
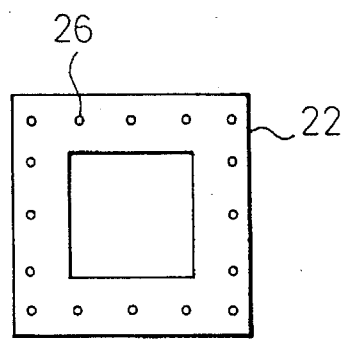
FIG. 2 is a plan view illustrating a ceramic plate.

In order to improve the sealing characteristics with respect to the sealing resin 32, it is preferable that the respective insulation sheets 16, the power supply layer 14, the ceramic plate 22, the conductive adhesive films 24a, 24b and the ground layer 20 be provided with through holes 26 for anchoring or bridging the sealing resin 32. FIG. 2 shows, as an example, the ceramic plate 22 having a plurality of through holes 26 for this purpose.

The ceramic plate 22 can be made as follows. A green sheet is made from a mixed slurry of a ferroelectric powder, such as barium titanate, strontium titanate, tantalum oxide powder, or the like, and a ceramic base material comprising a solvent, an organic binder, and a sintering aid. The green sheet is then sintered and ground to obtain a necessary thickness, such as 0.1 mm to 0.3 mm, more preferably about 0.15 mm.

If the ceramic plate is made mainly from barium titanate, as the ferroelectric powder, a dielectric constant, having a permissivity 2,000 to 3,000, or occasionally up to more than 6,000, can be obtained.

The ceramic plate 22 has a rectangular or square-frame shape which is substantially the same as the power supply layer 14. Such a frame-shaped ceramic plate 22 can be obtained by ultrasonic machining or laser machining the sheet, after the green sheet is sintered.

Such a frame-shaped configuration can also be obtained at the green sheet stage. However, this is not preferable because the dimension of the ceramic plate may change, or bending thereof may occur, due to the shrinkage in the sintering process.

Solder can also be used as the conductive adhesive material 24a and 24b. However, the difference in thermal expansion between the solder and the ceramic plate 22 is so large that the ceramic plate 22 may be damaged or broken. Therefore, it is preferable to use a conductive resin film which is made from an adhesive resin mixed with conductive metallic powder, such as silver or the like and formed as a sheet.

If the multi-layer lead-frame 10 is made as described above, a multi-layer lead-frame containing therein a decoupling capacitor having a large electrostatic capacitance, such as more than 10 nF, can be obtained. The reason is that a compact ceramic plate made by sintering ferroelectric powder is inserted between the metal layers.

In the above-mentioned embodiment, the multi-layer lead-frame comprises three layers but it should be understood that a multi-layer lead-frame comprising four or more layers, such as by having two power supply layers, can also be obtained in a similar manner as described above.

Figure 3:
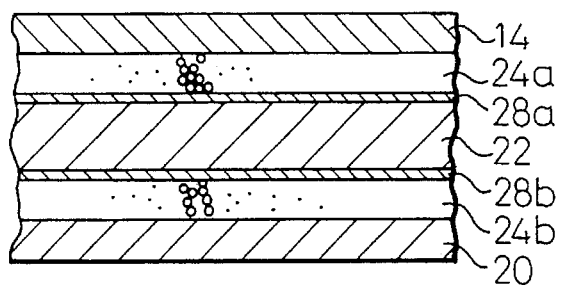
FIG. 3 is a partial cross-sectional view of a ceramic plate and metallic films formed on the respective surfaces of the ceramic plate.

FIG. 3 is an enlarged partial cross-sectional view of an embodiment of multi-layer lead-frame of this invention. Particularly, FIG. 3 shows parts of the power supply layer 14 and the ground layer 20. In this embodiment, metallic films 28a and 28b, such as gold-plated films, are formed on the respective surfaces of the ceramic plate 22 by an electroless plating process. Such metallic films 28a and 28b can also be formed by any suitable known method, such as vaporizing, sputtering or the like.

According to the present invention, since the ceramic plate 22 is provided, on the respective surfaces thereof, with metallic films 28a and 28b, an improved multi-layer lead-frame can be obtained so that the electrostatic capacitance can be increased and the high frequency characteristic becomes satisfactory.

Figure 4:
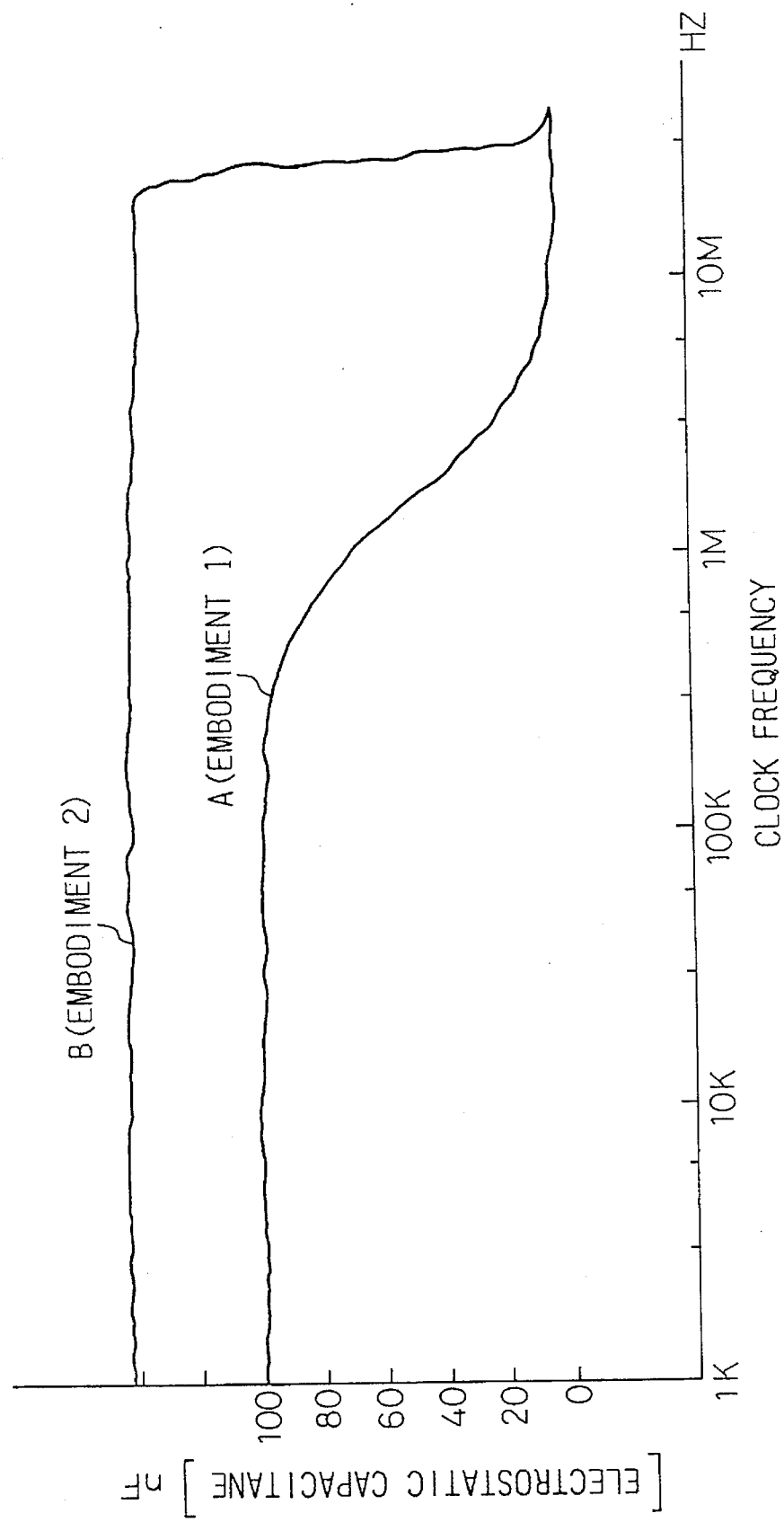
FIG. 4 is a diagram showing a relationship between the clock frequency and the statistic electric capacity.

FIG. 4 is a diagram showing the relationship between the clock frequency and the electrostatic capacitance in the case A (Embodiment 1) in which only the ceramic plate 22 was used and case B (Embodiment 2) in which metallic (in this case, Au) films 28a and 28b are formed on the respective surfaces of the ceramic plate 22.

As can be understood from FIG. 4, it has been found that the electrostatic capacitance is significantly increased in the case B in which Au films are formed on the respective surfaces of the ceramic plate 22. In addition, it has been found that, in case A in which only the ceramic plate 22 was used, the electrostatic capacitance abruptly reduces at a clock frequency around 300 KHZ and, on the contrary, in the case B in which Au films are formed, the electrostatic capacitance is substantially constant up to about 10 MHZ and then abruptly reduces at around 20 MHZ.

It is considered that the reason for the increase in the electrostatic capacitance between the metallic films on the respective surfaces of the ceramic plate 22 is that the contact resistance of the conductive adhesive films 24a and 24b is reduced by forming the metallic films 28a and 28b and the metallic films 28 and 28 function as electrodes, the distance between the electrodes being reduced. The reasons why the electrostatic capacitance is stable to a high frequency region are not clearly understood. Any conductive film available and sold in the market, such as "STAYFORM" (trademark) manufactured by Alphametals, Co. Inc., a U.S. company, or "ABLEFILM" (trademark) manufactured by ABLESTIK Co. Inc., a U.S. company, can be used as the conductive adhesive films 24a and 24b in this embodiment.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

We claim:

1. A multi-layer lead-frame for a semiconductor device comprising:

a signal layer made of a metal strip having a signal pattern therein and including a plurality of lead lines;

a first metal layer;

an insulation sheet adhering and laminating said first metal layer to a surface of said signal layer;

a second metal layer;

a ceramic plate, comprising a sintered body consisting essentially of barium titanate and strontium titanate and a ceramic base material and excluding any polyimide, having opposite major surfaces and disposed between said first metal layer and said second metal layer;

respective metallic films formed on the opposite major surfaces of said ceramic plate; and electrically conductive adhesive material disposed between and adhering said respective metallic films formed on said opposite major surfaces of said ceramic plate to said first metal layer and said second metal layer, respectively.

2. A multi-layer lead-frame as set forth in claim 1, wherein said first metal layer is a power supply layer and said second metal layer is a ground layer.

3. A multi-layer lead-frame as set forth in claim 1, wherein said conductive adhesive material is a conductive adhesive film made of a mixture of an adhesive resin and a metallic powder.

4. A multi-layer lead-frame as set forth in claim 1, wherein said metallic films are plated gold.

5. A multi-layer lead-frame as set forth in claim 1, wherein at least one of said first metal layer, said second metal layer, said ceramic plate and said conductive adhesive material has a plurality of through holes through which a sealing resin extends.

* * * * *